:::

United States Patent
Laine et al.

(10) Patent No.: US 8,334,575 B2
(45) Date of Patent: Dec. 18, 2012

(54) SEMICONDUCTOR DEVICE AND ELECTRONIC DEVICE

(75) Inventors: Jean Philippe Laine, Cugnaux (FR); Patrice Besse, Toulouse (FR); Alexis Huot-Marchand, Labarthe sur Leze (FR)

(73) Assignee: Freescale Semiconductor, Inc., Austin, TX (US)

( * ) Notice: Subject to any disclaimer, the term of this patent is extended or adjusted under 35 U.S.C. 154(b) by 72 days.

(21) Appl. No.: 13/122,035

(22) PCT Filed: Oct. 3, 2008

(86) PCT No.: PCT/IB2008/055323
§ 371 (c)(1), (2), (4) Date: Mar. 31, 2011

(87) PCT Pub. No.: WO2010/038101
PCT Pub. Date: Apr. 8, 2010

(65) Prior Publication Data
US 2011/0180876 A1    Jul. 28, 2011

(51) Int. Cl.
*H01L 27/11* (2006.01)
*H01L 21/8238* (2006.01)
*H03K 17/0812* (2006.01)
*H03K 17/16* (2006.01)

(52) U.S. Cl. .................................... 257/379; 438/210
(58) Field of Classification Search .............. 438/151, 438/190, 210, 238; 257/350, 379
See application file for complete search history.

(56) References Cited

U.S. PATENT DOCUMENTS

| | | | |
|---|---|---|---|
| 6,064,093 A * | 5/2000 | Ohta | 257/355 |
| 6,373,104 B1 | 4/2002 | Smith et al. | |
| 6,621,108 B2 * | 9/2003 | Tashiro et al. | 257/173 |
| 6,787,858 B2 | 9/2004 | Zitouni et al. | |
| 6,825,504 B2 * | 11/2004 | Ishizuka et al. | 257/173 |
| 7,145,187 B1 | 12/2006 | Vashchenko et al. | |
| 7,916,439 B2 * | 3/2011 | Zecri et al. | 361/56 |

FOREIGN PATENT DOCUMENTS

EP    0865161 A    9/1998
EP    1624570 A    2/2006

OTHER PUBLICATIONS

A Sedra; K Smith: "Microelectronic Circuits" 1987, Holt, Rinehart and Winston, New York, XP002535871, Figure P7.26.

(Continued)

*Primary Examiner* — Calvin Lee

(57) ABSTRACT

A semiconductor device comprises a switching element. The switching element comprises a first channel terminal, a second channel terminal and a switching terminal. One of the first and second channel terminals provides a reference terminal and the switching element is arranged such that an impedance of the switching element between the first channel terminal and second channel terminal is dependant upon a voltage across the switching terminal and the reference terminal. The semiconductor device further comprises a first resistance element operably coupled between the first channel terminal and the switching terminal and a second resistance element operably coupled between the switching terminal and the second channel terminal of the semiconductor device. When a negative current is encountered at the first channel terminal, the negative current causes both a voltage drop across the switching terminal and the first channel terminal and a voltage drop across the second channel terminal and the switching terminal.

20 Claims, 3 Drawing Sheets

OTHER PUBLICATIONS

Rhein D: "Tasks and Realisation of Input Circuit Protection in Integrated MOS Circuits // Aufgaben und Realiserungvon von Eingangsschutzschaltungen Integrierter MOS-Schaltkreise" Nachrichtentechnik Electronik, VB Verlag Technik, Berlin, DE, vol. 37, No. 2, Jan. 1, 1987, pp. 76-78.

"Five Different Rules: How Good-Natured CMOS ICs Don't Latch Any More" 19891003, vol. 24, No. 19, Oct. 3, 1989, pp. 40-42, 44.
International Search Report and Written Opinion correlating to PCT/IB2008/055323 dated Jul. 20, 2009.

* cited by examiner

US 8,334,575 B2

SEMICONDUCTOR DEVICE AND ELECTRONIC DEVICE

FIELD OF THE INVENTION

The field of the invention relates to a semiconductor device and in particular to a semiconductor device comprising a switching element.

BACKGROUND OF THE INVENTION

In the field of integrated circuits and semiconductor devices, it is known that electronic circuits located on a semiconductor substrate are vulnerable to the injection of charge carriers into the semiconductor substrate. In particular, the injection of charge carriers into the semiconductor substrate can seriously disturb the operation of the electronic circuitry located thereon, and in more severe cases can cause a well known phenomenon known as latch-up.

A known cause of this unwanted injection of charge carriers into the semiconductor substrate is high negative stress current or negative voltage occurring on external pins of a semiconductor device, thereby activating parasitic effects of p-n junctions within the substrate. For example, it is known for semiconductor devices to comprise power MOSFETs (Metal Oxide Semiconductor Field Effect Transistor) that are used to drive external devices such as lights, motors, etc. Often, such external devices comprise inductive properties whereby, when the MOSFET is turned 'off', the external devices initially continue to draw current. As a result, the MOSFET terminal coupled to the external devices will experience a high negative stress current. Due to the structure of a MOSFET terminal, when such a negative current is applied to the terminal of the MOSFET, a p-n junction of the MOSFET creates a parasitic diode structure, which injects unwanted charge carriers into the substrate of the semiconductor device.

FIG. 1 illustrates an example of a typical structure for an N-channel MOSFET 100 located on a semiconductor substrate 110. The semiconductor substrate 110 comprises semiconductor material doped with positive charge carriers, and provides a p-doped 'body' for the N-channel MOSFET 100. Two n-doped regions 120, 130, doped with negative charge carriers, are formed within the surface of the semiconductor substrate 110, each of which is operably coupled to a conductive contact 140, 150, one for each of a source and drain terminal of the N-channel MOSFET 100 respectively. A third conductive contact 160, providing a gate terminal for the N-channel MOSFET 100, is located generally between the two n-doped regions 120, 130, adjacent a region of the p-doped semiconductor substrate 110. An insulating layer 170 is located between the gate contact 160 and the p-doped semiconductor substrate 110. When a positive voltage is applied to the gate contact 160, positive charge carriers build up within the gate contact 160, repelling the positive charge carriers within the p-doped substrate 110 away from the gate contact 160. If a sufficiently high voltage is applied to the gate contact 160, a depletion layer is formed within the p-doped substrate 110 adjacent the insulating layer 170, thereby allowing current to flow between the two n-doped regions 120, 130.

As can be seen in FIG. 1, the p-doped substrate 110 forms a p-n junction with each of the n-doped regions 120, 130. Accordingly, if a negative current is applied to either of the source or drain contacts 140, 150, negative charge carriers are introduced into the respective n-doped region 120, 130. If no depletion layer is present, a parasitic diode behaviour of the p-n junction structure is activated. As a result, the negative current applied to the n-doped region 120, 130 is equivalent to applying a forward bias across the p-n junction, resulting in negative charge carriers being injected into the p-doped substrate, and thereby positive charge carriers being removed from the p-doped substrate.

FIG. 2 illustrates an example of a known protection circuit for an N-channel MOSFET 200. A source terminal of the N-channel MOSFET 200 is operably coupled to an external contact 210 of, for example, a semiconductor device (not shown) on which the N-channel MOSFET 200 is located. In this manner, the N-channel MOSFET 200 may be used to drive external devices.

As previously mentioned, if a high negative current is applied to the source or drain terminals of the N-channel MOSFET 200, parasitic diode behaviour of the p-n junction structures is activated. This parasitic diode behaviour is illustrated in FIG. 2 in the form of diodes $D_s$ 220 and $D_d$ 230. Also illustrated in FIG. 2 is an example of a known technique for providing protection against high negative stress current at the external contact 210.

The protection comprises a diode 240 coupled in series between the external contact 210 and ground. In this manner, when a negative current is present at the external contact 210, current is able to be drawn from ground through this diode 240, thereby significantly reducing the current drawn from the source terminal of the N-channel MOSFET 200. As a result, the injection of charge carriers into the semiconductor substrate is also significantly reduced.

However, a problem with this known technique for providing protection against high negative stress currents is that, although the diode is capable of supplying the majority of the current drawn by the negative stress current event, a not insignificant amount of current is still drawn from the N-channel MOSFET 200. As a result, some charge carriers are still injected into the semiconductor substrate. For example, in simulations comprising a negative stress current of 1 amp, the current level through the substrate reached several milliamps, which is still capable of severely disturbing the operation of components located on the substrate.

A further problem with this known technique for providing protection against high negative stress currents is that the negative voltage that may be generate at the external contact (known as a clamping voltage) is solely dependent on the specific negative stress current. This clamping voltage is not configurable, or 'tuneable', since it is controlled by the voltage drop caused by the diodes.

More complex techniques for providing protection against high negative stress currents are known that comprise adding specific mask technology to avoid any activation of unexpected parasitic effects. However, the cost of implementing such complex techniques is not insignificant, and as such these techniques are not an attractive solution in a competitive market.

SUMMARY OF THE INVENTION

Embodiments of the invention provide a semiconductor device and an electronic device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF EMBODIMENTS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 3:
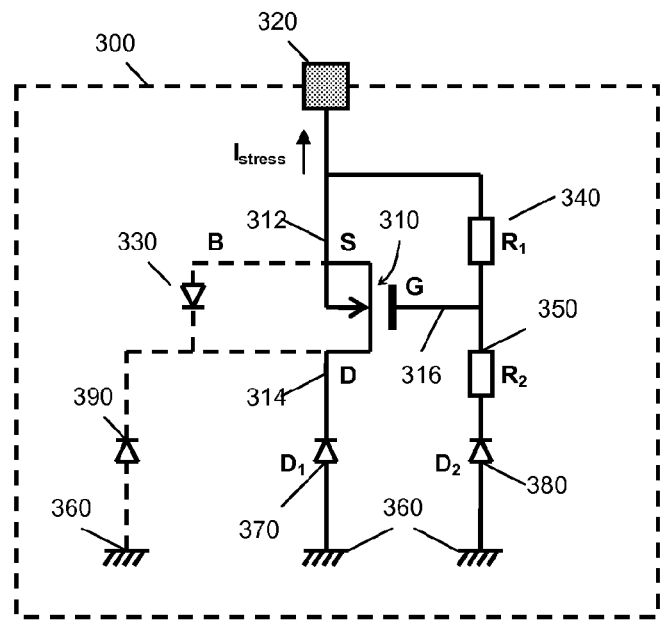
FIG. 3 illustrates an example of a part of a semiconductor device.

Referring now to FIG. 3, there is illustrated an example of a part of a semiconductor device 300 according to some embodiments of the present invention. The semiconductor device 300 comprises a switching element 310 comprising a first channel terminal 312, a second channel terminal 314 and a switching terminal 316. The switching element 310 is arranged such that an impedance of the switching element 310 between the first channel terminal 312 and the second channel terminal 314 is dependant upon a voltage across the switching terminal 316 and a reference terminal provided by one of the channel terminals 312, 314.

For the illustrated embodiment, the switching element 310 is in a form of an N-channel MOSFET (Metal Oxide Semiconductor Field Effect Transistor), with the first channel terminal 312 comprising the source terminal of the N-channel MOSFET and providing the reference channel. The second channel terminal 314 comprises the drain terminal of the N-channel MOSFET, and the switching terminal 316 comprises the gate terminal of the N-channel MOSFET.

Figure 4:
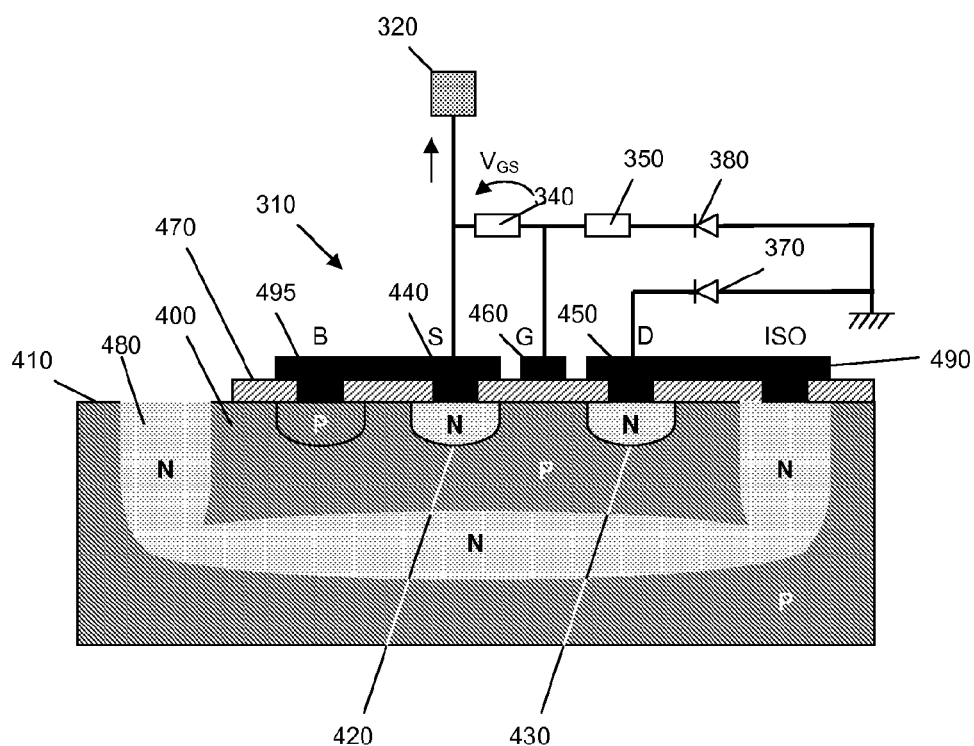
FIG. 4 illustrates an example of a structure for an N-channel MOSFET of FIG. 3.

FIG. 4 illustrates an example of a structure for the N-channel MOSFET 310 of FIG. 3. The N-channel MOSFET 310 is located generally on a surface 410 of a material doped with positive charge carriers, for example which forms a part of the semiconductor device 300, and which provides a p-doped substrate 400. The N-channel MOSFET 310 comprises two n-doped regions 420, 430, doped with negative charge carriers, and which are formed within the surface 410 of the p-doped substrate 400. Each of the n-doped regions 420, 430 is operably coupled to a conductive contact 440, 450 respectively, one for each of the source and drain terminals 312, 314 of the N-channel MOSFET 310 respectively. A third conductive contact 460, providing the gate terminal 316 for the N-channel MOSFET 310, is located generally between the two n-doped regions 420, 430, adjacent a region of the p-doped substrate 400. An insulating layer 470 is located between the gate contact 460 and the surface 410 of the p-doped substrate 400.

In this manner, when a positive voltage is applied to the gate contact 460, positive charge carriers, e.g. holes, build up within the gate contact 460, thereby repelling positive charge carriers within the p-doped substrate 410 away from the gate contact 460. If a voltage drop across the gate terminal 316 and the source terminal 312 exceeds a switching voltage threshold, a depletion layer 405 is formed within the p-doped substrate 400 adjacent the surface 410 thereof, between the two n-doped regions 420, 430, thereby allowing current to flow there between.

As can be seen, the p-doped substrate 400 forms a p-n junction with each of the n-doped regions 420, 430. Accordingly, if a negative current is encountered at either of the source or drain contacts 440, 450, negative charge carriers, for example electrons, are introduced into the respective n-doped regions 420, 430. If no depletion layer is present, a parasitic diode behaviour of the p-n junction structure is activated. As a result, the negative current applied to the n-doped region 420, 430 is equivalent to applying a forward bias across the p-n junction, thereby resulting in negative charge carriers being injected into the p-doped substrate 400, and positive charge carriers being removed from the p-doped substrate. Thus, there is a risk that the injection of unwanted charge carriers into the substrate of the semiconductor device, disturbs the operation of electronic circuitry located thereon, and in more serious cases could cause latchup of circuitry located on the semiconductor device.

For the example illustrated in FIG's 3 and 4, a first resistance element 340 is operably coupled between the source terminal 312 and the gate terminal 316, and a second resistance element 350 is operably coupled between the gate terminal 316 and the drain terminal 314. In particular, the first and second resistance elements 340, 350 are operably coupled to the terminals 312, 314, 316 of the N-channel MOSFET 310 such that, when a negative current is encountered at the source terminal 312, the negative current causes a voltage drop across the gate terminal 316 and the source terminal 312, and a voltage drop across the drain terminal 314 and the gate terminal 316.

In this manner, when a large enough negative current is encountered at the source terminal 312, for example due to an ESD (Electrostatic Discharge) event or inductive properties of a device being driven by the N-channel MOSFET 310, the voltage drop across the gate terminal 316 and the source terminal 312 exceeds the switching voltage threshold for the N-channel MOSFET 310, switching the N-channel MOSFET 'on'. As a result, current is able to flow through the N-channel MOSFET 310, from the drain terminal 314 to the source terminal 312, thereby substantially preventing the parasitic diode behaviour of the p-n junction structure between the n-doped region 420, corresponding to the source terminal 312, and the p-doped substrate 400 of the semiconductor device 300 that would otherwise occur.

In this manner, the arrangement of the resistive elements 340, 350 provides the N-channel MOSFET 310 with protection against high negative stress currents by enabling the N-channel MOSFET 310 to be switched on to allow the current to flow through the N-channel MOSFET 310, as opposed to activating the parasitic diode behaviour of the p-n junction structure within the N-channel MOSFET 310. Furthermore, a clamping voltage of the protection circuitry, namely the voltage at the source terminal 312 that is required in order for the N-channel MOSFET 310 to be switched on, may be configured by selecting appropriate values for the resistance elements 340, 350.

For the illustrated embodiment, the drain terminal 314 is operably coupled to a ground plane 360 of the semiconductor device 300. In this manner, when a large negative current is encountered at the source terminal 312, such that the N-channel MOSFET 310 is switched 'on', instead of negative charge carriers being injected into, the substrate 400 and positive charge carriers being removed from the substrate 400 of the semiconductor device 300, the ground plane 360 provides a source of positive charge carriers for, and receives negative charge carriers from, the negative current encountered at the source terminal 312. In this manner, the parasitic diode structure of the p-n junction between the substrate 400 and the n-doped region 420, 430 is effectively shorted out during a negative stress current event.

Furthermore, in this example, the MOSFET 310 is isolated by n-doped material 480, the n-doped material 480 substantially isolating the MOSFET 310 from other parts of the semiconductor device 300. The n-doped material 480 is operatively coupled to an electrically conductive contact 490, which for the illustrated embodiment is operably coupled to the drain terminal 450 of the MOSFET 310, whilst the source terminal 440 is operatively coupled to a body contact 495.

The junction between the p-doped substrate 400 of the semiconductor device 300 and the n-doped isolation region 480 create a p-n junction structure, which may be represented by an isolation diode 390 (as shown in FIG. 3) between the drain terminal 314 and ground 360. As will be appreciated, by connecting the drain terminal 314 to the n-doped isolation region 480, as is the case for the illustrated embodiment, when a large negative current is encountered at the source terminal 312, such that the N-channel MOSFET 310 is switched 'on', the isolation diode 390 could become forward biased. This would result in charge carriers being injected into the substrate of the semiconductor device 300. In the example, the drain terminal 314 is operatively coupled to the ground plane 360. In this manner, the isolation diode 390 is effectively short circuited, thus preventing the injection of charge carriers into the substrate of the semiconductor device 300 via the isolation diode 390.

As illustrated, in FIG. 3, the drain terminal 314 may be operably coupled to the ground plane 360 via a diode element 370, the diode element 370 being forward biased in a direction from the ground plane 360 towards the drain terminal 314. In this manner, during normal operation of the N-channel MOSFET 310, when the drain terminal 314 comprises a generally positive potential, the drain terminal 314 is substantially isolated from the ground plane 360.

As previously mentioned, the gate terminal 316 is operably coupled to the drain terminal 314 via the second resistance element 350. For the illustrated embodiment, the second resistance element 350 is also operably coupled to the ground plane 360, and in this manner is operably coupled to the drain terminal 314 via the ground plane 360. As will be appreciated, the arrangement of the resistance elements 340, 350 for the embodiment illustrated in FIG. 3 forms protection circuitry comprising a voltage divider circuit between the source terminal 312 and the ground plane 360, with the gate terminal 316 being operably coupled to the divisional voltage. In this manner, the clamping voltage of the protection circuitry may easily be configured by selecting appropriate values for the resistance elements 340, 350. Advantageously, this enables the protection circuitry to be easily tailored to meet the requirements for specific applications, for example as specified by customers of the semiconductor manufacturer.

As illustrated, and in the same manner as for the drain terminal 314, the second resistance element 350 may be operably coupled to the ground plane 360 via a diode element 380, the diode element 380 being forward biased in a direction from the ground plane 360 towards the second resistance element 350. In this manner, during normal operation of the N-channel MOSFET 310, when the gate terminal 316 comprises a generally positive potential, the gate terminal 316 is substantially isolated from the ground plane 360.

The junction between the p-doped substrate 400 of the semiconductor device 300 (to which the source terminal 312 is operatively coupled via body contact 495) and the n-doped region 430 of the drain terminal 314 also create a p-n junction structure, which may be represented by a body diode 330 (in FIG. 3) between the source and drain terminals 312, 314. As will be appreciated, when a positive voltage potential is experience across the source and drain terminals above 0.6 v, for example during normal operation of the MOSFET, a high leakage current may be expected via the body diode 330. However, the provision of the diode elements 370, 380 between the drain and gate terminals 314, 316 and the ground plane 360 substantially prevent high leakage current flowing through the body diode 330 to ground.

It is contemplated that the switching element, for example in a form of an N-channel MOSFET 310 may be used to drive external devices (not shown). Accordingly, for the illustrated embodiment, the source terminal 312 is operably coupled to an external contact 320 of the semiconductor device 300.

Although for simplicity each of the resistance elements 340, 350 has been illustrated and herein described as a single component, it is envisaged that they may each comprise one or more components, for example operably coupled in series, in parallel or in a combination of series and parallel arrangements, as required to achieve the desired resistances. It is also envisaged that, other components, for example such as the diodes, are also not limited to a single component, and may be implemented using a plurality of components, if required, to achieve a desired functionality.

Figure 1:
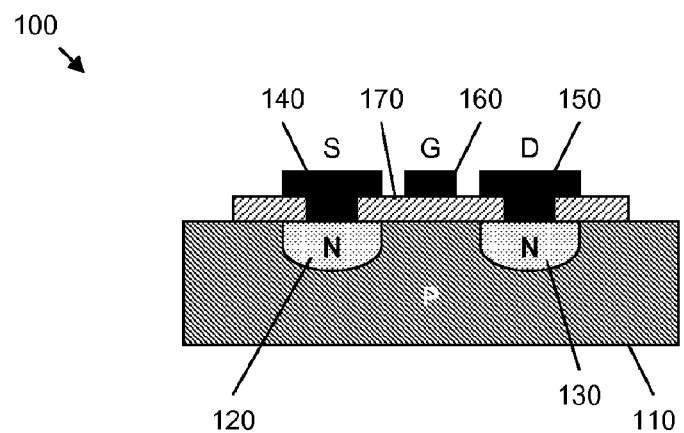
FIG. 1 illustrates an example of a typical structure for an N-channel MOSFET
Figure 2:
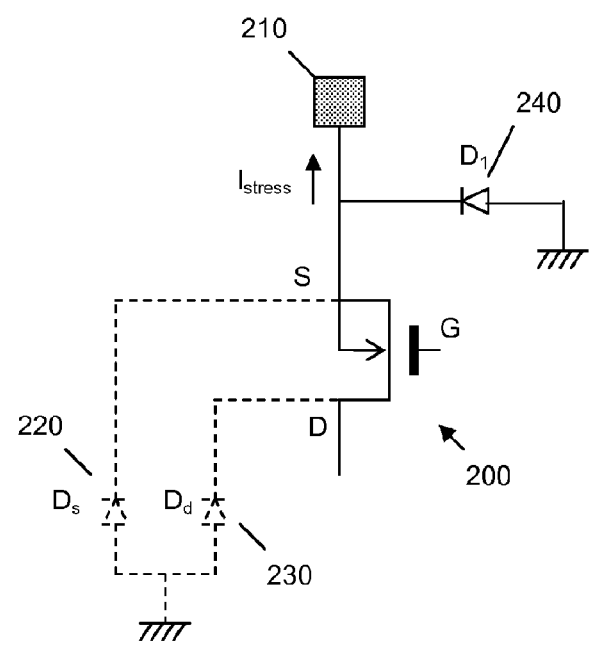
FIG. 2 illustrates an example of a known protection circuit for an N-channel MOSFET.
Figure 5:
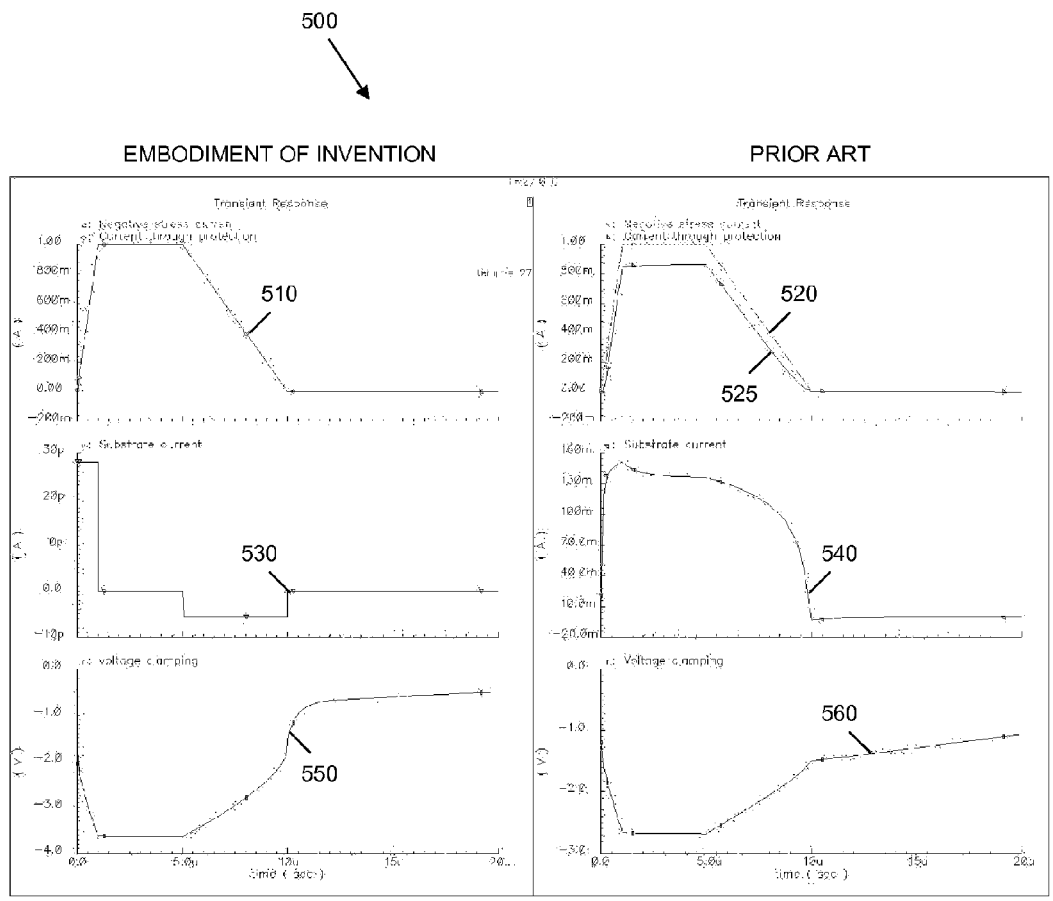
FIG. 5 illustrates simulation results for a negative stress current applied to the example of a structure illustrated in FIG. 3 and the prior art circuitry of FIG. 1.

Referring now to FIG. 5, there is illustrated simulation results for a negative stress current applied to the example illustrated in FIG. 3 and the prior art circuitry of FIG. 1. Plot 510 represents the negative stress current applied to the example of a embodiment of the invention, as well as the current flowing through the protection circuitry, which were substantially equal. Plot 520 represents the negative stress current applied to the prior art circuitry. As can be seen, comparable negative stress currents of 1 A were applied to each circuit. Plot 525 represents the current flowing through the prior art protection circuitry, which as can be seen was not all of the negative stress current applied.

Referring now to plots 530 and 540, these represent the current within the semiconductor substrate for each of the semiconductor devices 300, 100 of the example of a embodiment of the invention and the prior art respectively, caused by the injection of charge carriers into the substrate as a result of parasitic effects of p-n junctions within the switching elements. As can be seen, in the simulation of the prior art circuit, the current level through the substrate reached several milliamps, which is high enough for the operation of electronic circuitry located on the semiconductor device to be severely disturbed. In contrast, for the example of a embodiment of the invention, the current level through the substrate was significantly less than 1 nA, which is sufficiently low to substantially avoid disturbances to circuitry on the semiconductor device.

Referring now to plots 550 and 560, these represent the voltage values at the external contacts 320, 210 of FIG. 3. As can be seen, for the example of a embodiment of the invention, the voltage was substantially clamped at approximately 3.6V, whilst for the prior art arrangement, the voltage was clamped at approximately 2.6V. As previously mentioned, whilst this clamping voltage cannot be adjusted for the prior art arrangement, the clamping voltage for the example of a embodiment of the invention may easily be adjusted as required by selecting appropriate resistive elements 340, 350 in FIG. 3.

As will be appreciated, an improved protection against negative stress current as compared with the prior art technique of FIG. 1 may be obtained, thereby significantly reducing the injection of charge carriers into the semiconductor substrate. As a result, the problem of the operation of components located on the semiconductor device being disturbed by such injection of charge carriers, and in particular the problem of latch-up may be reduced.

Furthermore, the clamping voltage of the protection circuitry may be made adjustable, and thereby be substantially tailored to meet application specific requirements.

Furthermore, the examples can be implemented using simple and inexpensive components, substantially avoiding the need for more complex techniques requiring specific mask technology to avoid any activation of unexpected parasitic effects.

Thus, a likelihood of negative stress events such as electrostatic discharge, energy stress, Schaffner pulses, inductive discharge, electromagnetic interference, etc, causing disturbances to the operation of components located on a semiconductor device, or even latchup may be reduced. Consequently, the reliability of a semiconductor device, and thereby of an integrated circuit comprising such a semiconductor device, and an electronic device comprising such an integrated circuit may be improved. Furthermore, such improved reliability may be obtained without significant increases in complexity, cost or size.

In the foregoing specification, the invention has been illustrated with references to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

Although the invention has been described with respect to specific conductivity types or polarity of potentials, skilled artisans appreciated that conductivity types and polarities of potentials may be reversed.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor device comprising:
   a switching element, the switching element comprising a first channel terminal, a second channel terminal and a switching terminal the first channel terminal being operably coupled to an external contact of the semiconductor device;
   wherein the first channel terminal is arranged to provide a reference terminal and the switching element is arranged such that an impedance of the switching element between the first channel terminal and second channel terminal is dependant upon a voltage across the switching terminal and the reference terminal, whereby when a voltage drop across the switching terminal and the reference terminal exceeds a switching voltage threshold for the switching element current is able to flow between the first and second channel terminals;
   wherein the semiconductor device further comprises a first resistance element operably coupled between the first channel terminal and the switching terminal and a second resistance element operably coupled between the switching terminal and the second channel terminal of the semiconductor device such that when a negative current is encountered at the first channel terminal, the negative current causes both a voltage drop across the switching terminal and the first channel terminal and a voltage drop across the second channel terminal and the switching terminal.

2. The semiconductor device of claim 1 wherein the second channel terminal is operably coupled to a ground plane of the semiconductor device.

3. The semiconductor device of claim 2 wherein the second channel terminal is operably coupled to the ground plane via a first diode element, the first diode element being forward biased in a direction from the ground plane towards the second channel terminal.

4. The semiconductor device of claim 3 wherein the switching terminal is operably coupled to the ground plane, via the second resistance element and a second diode element, the second diode element being forward biased in a direction from the ground plane towards the switching terminal.

5. The semiconductor device of claim 3 wherein the switching element comprises a Metal Oxide Semiconductor Field Effect Transistor, MOSFET.

6. The semiconductor device of claim 3 wherein the first channel terminal is operably coupled to an external contact of the semiconductor device and the switching element is arranged to drive an external device.

7. An electronic device comprising the semiconductor device of claim 3.

8. The semiconductor device of claim 2 wherein the switching terminal is operably coupled to the ground plane, via the second resistance element and a second diode element, the second diode element being forward biased in a direction from the ground plane towards the switching terminal.

9. The semiconductor device of claim 8 wherein the switching element comprises a Metal Oxide Semiconductor Field Effect Transistor, MOSFET.

10. The semiconductor device of claim 8 wherein the first channel terminal is operably coupled to an external contact of the semiconductor device and the switching element is arranged to drive an external device.

11. An electronic device comprising the semiconductor device of claim 8.

12. The semiconductor device of claim 2 wherein the switching element comprises a Metal Oxide Semiconductor Field Effect Transistor, MOSFET.

13. The semiconductor device of claim 2 wherein the first channel terminal is operably coupled to an external contact of the semiconductor device and the switching element is arranged to drive an external device.

14. An electronic device comprising the semiconductor device of claim 2.

15. The semiconductor device of claim 1 wherein the switching element comprises a Metal Oxide Semiconductor Field Effect Transistor, MOSFET.

16. The semiconductor device of claim 15 wherein the switching element comprises an N-channel MOSFET, and the first channel terminal comprises a source terminal of the N-channel MOSFET, the second channel terminal comprises a drain terminal of the N-channel MOSFET, and the switching terminal comprises a gate terminal of the N-channel MOSFET.

17. The semiconductor device of claim 16 wherein the first channel terminal is operably coupled to an external contact of the semiconductor device and the switching element is arranged to drive an external device.

18. The semiconductor device of claim 15 wherein the first channel terminal is operably coupled to an external contact of the semiconductor device and the switching element is arranged to drive an external device.

19. The semiconductor device of claim 1 wherein the first channel terminal is operably coupled to an external contact of the semiconductor device and the switching element is arranged to drive an external device.

20. An electronic device comprising the semiconductor device of claim 1.

* * * * *